United States Patent
Djaja et al.

(10) Patent No.: US 6,405,160 B1
(45) Date of Patent: Jun. 11, 2002

(54) MEMORY COMPILER INTERFACE AND METHODOLOGY

(75) Inventors: Gregory Djaja, Phoenix; James W. Nicholes, Chandler; Douglas D. Smith, Mesa; David William Knebelsberger, Chandler; Gary Wayne Hancock, Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/128,272

(22) Filed: Aug. 3, 1998

(51) Int. Cl.[7] .................................................. G06F 9/28
(52) U.S. Cl. ............................... 703/24; 703/27; 716/2; 710/16; 717/27; 717/11
(58) Field of Search ............................... 703/24, 21, 27; 710/16, 38; 365/230; 716/2; 717/11, 5, 9

(56) References Cited

U.S. PATENT DOCUMENTS

| | | | | |
|---|---|---|---|---|
| 5,566,127 A | * | 10/1996 | Hoshizaki | 365/230.06 |
| 5,572,482 A | * | 11/1996 | Hoshizaki et al. | 365/233 |
| 5,737,270 A | * | 4/1998 | Oppold et al. | 365/203 |
| 5,742,814 A | * | 4/1998 | Balasa et al. | 395/613 |
| 5,963,454 A | * | 10/1999 | Dockser et al. | 364/488 |
| 6,002,633 A | * | 12/1999 | Oppold et al. | 365/230.03 |
| 6,023,565 A | * | 2/2000 | Lawman et al. | 395/500.02 |

* cited by examiner

*Primary Examiner*—Kevin J. Teska
*Assistant Examiner*—Thai Phan
(74) *Attorney, Agent, or Firm*—Robert F. Hightower

(57) ABSTRACT

A compiler methodology including a stand alone memory interface which provides a user specified memory device of a required number of words of memory of a required bits per word. The stand alone memory interface is a tool to provide a menu showing multiple ways in which the user's request can be physically configured by varying the number of rows of memory, the number of blocks of memory, and the column multiplexing factor of the memory array. From this menu the user selects the memory configuration that best meets the user's requirements and is provided with either various models or representations (views) of the selected memory configuration or a GDS format data file. The views can be used to design large scale integrated circuits in which the memory device is embedded while the data file is used to generate photo mask for making the memory device as an integrated circuit.

9 Claims, 6 Drawing Sheets

| ITERATION | C GATE (fF) | C METAL (fF) | C CELL (fF) | C TOTAL (fF) 512 PLACEMENTS | I (mA) dV/dt=3.3/20 | METAL WIDTH(μ) 0.8mA/μ | % INCREASE OF 0.9μ WIDTH | % CHANGE |
|---|---|---|---|---|---|---|---|---|
| 1 | 9.7 | 3.8 | 13.5 | 6912 | 1.140 | 1.426 | 1.58 | 0.000 |
| 2 | 9.7 | 4.9 | 15.7 | 7475 | 1.233 | 1.542 | 1.71 | 0.129 |
| 3 | 9.7 | 6.5 | 16.2 | 8294 | 1.369 | 1.711 | 1.90 | 0.188 |
| 4 | 9.7 | 7.2 | 16.9 | 8653 | 1.428 | 1.785 | 1.98 | 0.082 |
| 5 | 9.7 | 7.5 | 17.2 | 8806 | 1.453 | 1.816 | 2.02 | 0.035 |
| 6 | 9.7 | 7.7 | 17.3 | 8858 | 1.462 | 1.827 | 2.03 | 0.012 |
| 7 | 9.7 | 7.7 | 17.4 | 8909 | 1.470 | 1.837 | 2.04 | 0.012 |
| 8 | 9.7 | 7.8 | 17.4 | 8909 | 1.470 | 1.837 | 2.04 | 0.000 |
| 9 | 9.7 | 7.8 | 17.4 | 8909 | 1.470 | 1.837 | 2.04 | 0.000 |
| 10 | 9.7 | 7.8 | 17.4 | 8909 | 1.470 | 1.837 | 2.04 | 0.000 |

*FIG. 6*

| RAM | ROW | COL MUX | BLK | WIDTH MILS | HEIGHT MILS | AREA MILS | ASPECT RATIO | POWER mW/Mhz | READ ACCESS | ADDR SETUP | DATA SETUP |
|---|---|---|---|---|---|---|---|---|---|---|---|
| S004096W32S | 512 | 2 | 4 | 70.4 | 149.7 | 10480 | 2.13 | 2.42 | 3.9 | 0.8 | 0.3 |
| S004096W32S | 256 | 2 | 8 | 136.1 | 83.3 | 11211 | 1.63 | 1.75 | 3.8 | 0.8 | 0.3 |
| S004096W32S | 128 | 2 | 16 | 268.1 | 52.1 | 13204 | 5.15 | 1.64 | 4.3 | 0.6 | 0.4 |
| S004096W32S | 512 | 4 | 2 | 65.2 | 147.9 | 9606 | 2.27 | 2.62 | 3.8 | 0.6 | 0.4 |
| S004096W32S | 256 | 4 | 4 | 126.0 | 80.7 | 10027 | 1.56 | 1.81 | 3.7 | 0.6 | 0.4 |
| S004096W32S | 128 | 4 | 8 | 248.0 | 48.4 | 11463 | 5.13 | 1.53 | 4.1 | 0.7 | 0.3 |
| S004096W32S | 512 | 8 | 1 | 63.3 | 145.5 | 9206 | 2.30 | 3.15 | 3.5 | 0.4 | 0.4 |
| S004096W32S | 256 | 8 | 2 | 122.0 | 80.6 | 9712 | 1.52 | 2.22 | 3.9 | 0.5 | 0.5 |
| S004096W32S | 128 | 8 | 4 | 239.2 | 47.7 | 10951 | 5.02 | 1.81 | 4.3 | 0.5 | 0.4 |

*FIG. 8*

MEMORY COMPILER INTERFACE AND METHODOLOGY

BACKGROUND OF THE INVENTION

The present invention relates to a memory compiler for use in designing integrated memory arrays from user specifications and, more particularly, to a stand alone memory interface (SAMI) and methodology for use with a memory compiler to provide a user with a data file of any type of integrated memory circuit design which the user desires, such as SRAM, ROM, Register File, Dual Port, Synchronous or Asynchronous memory, etc.

One methodology used in the past, was to actually manufacture a user desired memory array in integrated circuit form and then test the memory array to determine if it met the user specifications. If not, another memory array would be manufactured and again tested. Several iterations could be gone through before the user would be satisfied with the operation of the memory array. This process was not only time consuming but not cost effective from the manufacturers stand point.

Another methodology of memory compilers is based upon a Tiling system. In this methodology a memory array of a given configuration, i.e., so many words and bits per word is provided with a given fixed periphery to drive the memory array. If the periphery requires, for example, a word-line buffer one of several buffers are selected. A fixed number of buffers are available to be selected, like tiles used in laying a floor plan, i.e., the circuit manufacture would have available a small buffer, a medium buffer, large buffer or even an extra-large buffer to use. The software compiler methodology would then determine from the size of the memory array to determine what size buffer to use to drive the array. Whichever size buffer has the driving capability closest to the driver requirement is placed, like tiles, into the compiled circuit. Thus, the pieces comprising the pheriphery driver all fit together to drive the memory array but are not optimized for size or speed but only to be "close" in size and driver capability.

Hence, a need exists, for an improved memory compiler methodology for allowing dynamically buffers of a peripheral driver circuit for driving a memory array based on user design specification and which can produce several iterations in real time to allow the user to chose the optimal memory array for his design.

BRIEF DESCRIPTION OF THE DRAWINGS

FIG. 6 is data table useful in explaining the iterations results for dynamically varying module cells for a particular memory device in accordance with the present invention;

FIG. 8 is an option table generated from a user specific requirements for a memory device of a particular memory architecture in accordance with the present invention.

DETAILED DESCRIPTION OF THE PREFERRED EMBODIMENT

Before turning to the Figures, a brief summary of the present invention is presented. What will be described is a compiler methodology including a Stand Alone Memory Interface (SAMI) tool for allowing a user to interface with the memory compiler. The SAMI provides the user with view tools for interfacing with commercially available simulation and evaluation software or a GDSII data file that can be used to embed the specified memory type into a integrated chip design of the user's choice. The user chooses the type of memory desired, such as a SRAM, ROM, Dual Port, Synchronous or Asynchronous memory, etc. The user also provides key architectural variables such as the fabrication process to be used from which the required memory shall be fabricated, the number of words of memory needed, the number of bits per word, and so forth which the user inputs into the SAMI. The SAMI tool interface generates a table of all possible ways in which the user's memory request can be configured architecturally by rows, blocks and column multiplexing along with a listing of critical parameters such as area, width, height sizing of the memory. From this table, the user can select the most desired architectural configuration option to meet the user's needs.

Figure 1:
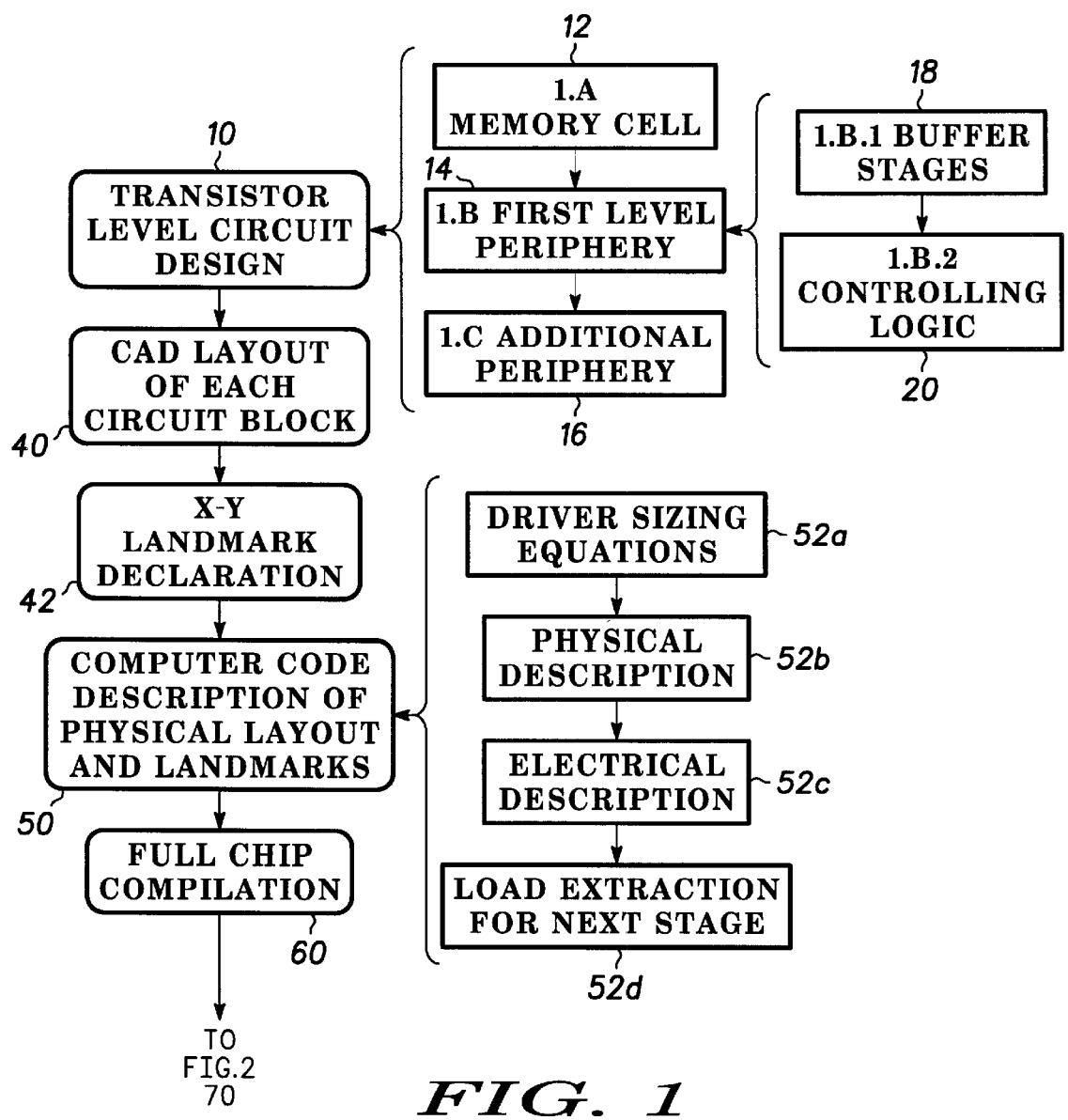
FIG. 1 is a portion of a flow diagram useful for explaining the preferred embodiment of the present invention.
Figure 2:
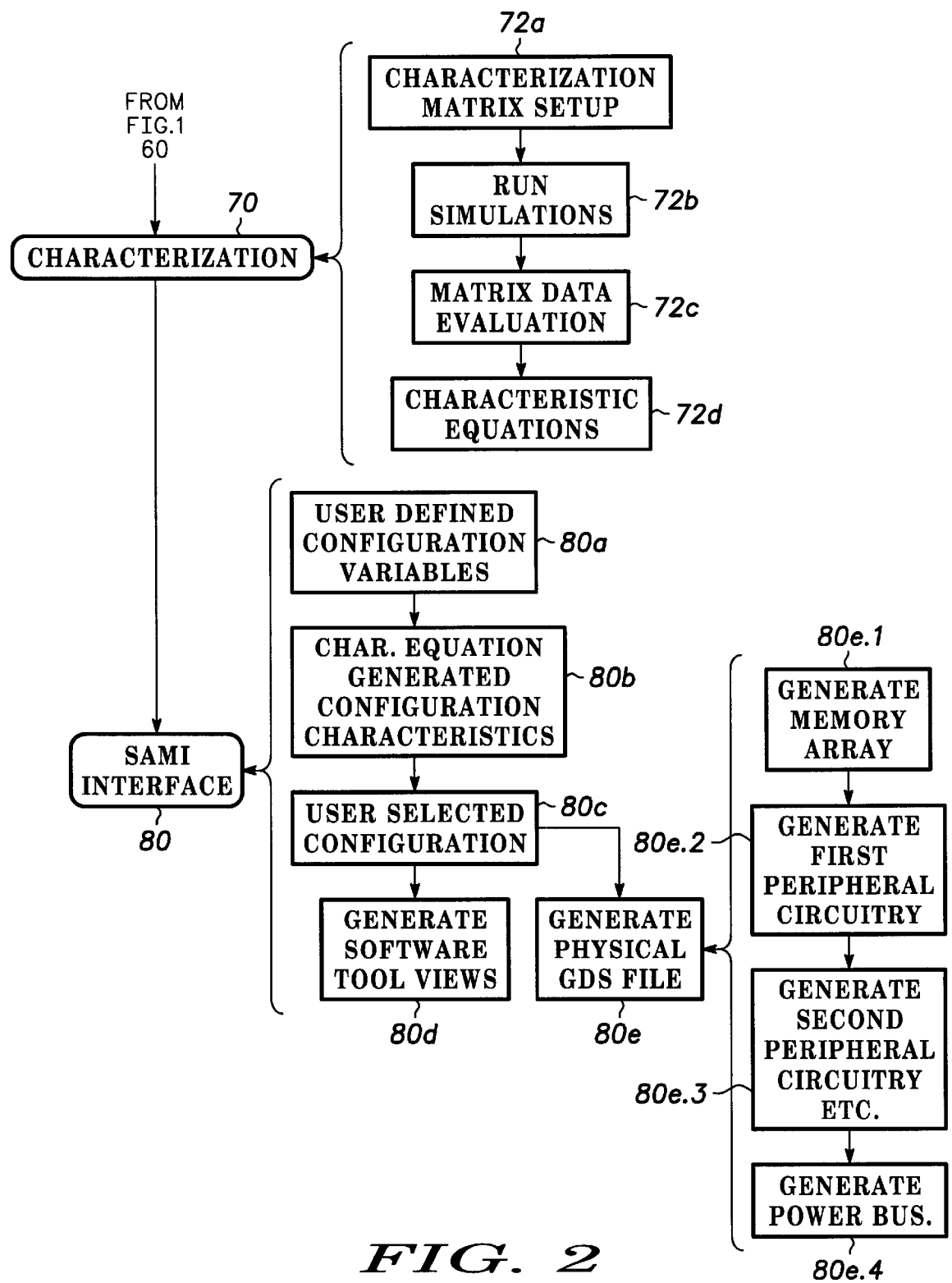
FIG. 2 is the remaining portion of the flow diagram of FIG. 1.

Turning now to FIG. 1 and FIG. 2, the flow of the compiler methodology of the preferred embodiment is described. The initial step in the compiler is the design of a baseline configuration of each memory architecture for each type of memory device, i.e., a SRAM, ROM, etc. from which the user may request in the future and prior to providing such memory devices to the user. It is important to note the following development steps in the flow, steps 10 through 60, are accomplish by the integrated circuit provider prior to any user contact based on the provider's past experience and general knowledge in the design of the different types of memory architecture.

Figure 3:
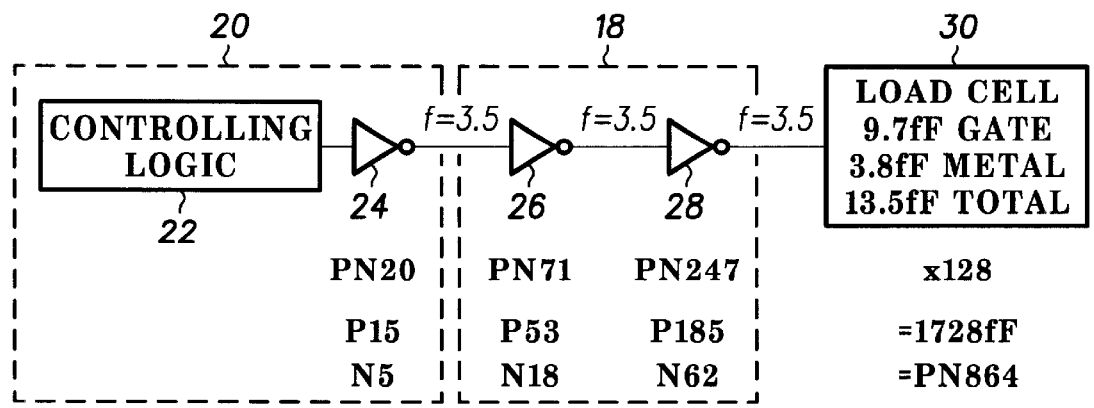
FIG. 3 is a partial block and schematic diagram used in explaining the first step of the flow diagram of FIG. 1.

The first development step 10 is the initial transistor level circuit design of the complete baseline configuration for all circuit blocks comprising a particular memory architecture (SRAM, ROM, etc.). The baseline configuration may or, not be a configuration that is utilized in the future but is utilized to set the initial relationship between all the circuitry blocks defining a particular memory architecture. Step 10 is carried out in three main stages as illustrated by substeps 12, 14, and 16. The first stage, substep 12, is to design the memory cell of the baseline configuration of the particular memory architecture expanding outwardly to establish the memory cell array of memory cells. The second stage, substep 14, is to design the first level of peripheral circuitry that interfaces directly to the memory array designed in the previous stage. This is principally the design of decoders, sense amplifiers, and data drivers and so forth, i.e., all of the separate circuit modules or blocks, necessary to drive into and out of the memory array. The third stage, substep 16, is the design of all additional peripheral circuitry blocks such as address buffers, clock drivers, I/O devices and so forth. As the memory cell is configured into an array of rows and columns, set by the baseline configuration, the capacitance loads of each of the separate module's circuitry at each array node are calculated. This calculation is shown by further substep stages 18 and 20. Although substeps 18 and 20 are shown depicted for substep 14, these two substeps are also required in the design of the additional peripheral circuits of substep 16. Thus, the capacitance load of each of the different module circuits such as decoders, sense amplifiers, address buffers and so forth coupled to each array node is extracted. Using the basic configuration for a buffer block, as illustrated in FIG. 3, which will drive all of the other modules of designed in substeps 14 and 16 the size of the dynamic buffers may be dynamically varied as the capacitance loading of the load cell to which the buffer block drives. Hence, as illustrated, each module circuitry comprising the peripheral circuitry of substeps 14 and 16 is divided into two circuit blocks, namely a buffer stage 18 which will drive load cell 30 and controlling logic block 20.

Determining the initial sizes of circuit blocks 18 and 20 of the baseline configuration is a critical step in the development flow of the present invention. The depiction of FIG. 3 is given by way of example. The controlling logic block 20 comprises controlling logic 22 and a single fixed size buffer 24 which drives the buffer block 18. Buffer block 18 comprises two scalable buffers 26 and 28 which can be resized for future configurations, depending on the load that they must drive. At this point in the designing step there are a number of key variables related to the process for fabricating the memory array that are assumed and which must be taken into account. For the example shown in FIG. 3, these variables are:

1) width per picofarad; the total amount of gate width of PMOS and NMOS transistor devices on an input node, the input of load cell 30, that have the combined capacitive load of 1.0 pF. (In this example, 500 $\mu$/ pF.);

2) beta ratio; the optimum ratio ($\beta$) of size between the PMOS device and the NMOS device of a buffer stage. (In this example 3.0.);

3) stage ratio (f); the baseline ratio of increasing size (total PMOS and NMOS) of one buffer stage to the next. (For this example 3.5.);

4) $I_{DM}$; the maximum current density allowed along a metal line to prevent electromigration defects on the metal line. (For this example 0.8 ma/$\mu$line width.);

5) $I_{DV}$, the maximum current density of an individual via (through hole) between two connected metal lines. (In this example 0.5 m/ via.); and 6) dV/dt; equal to 3.3 v/10 ns which represents the nominal voltage.

Keeping to these key variables and assuming that each load cell 30 has a PMOS/NMOS gate capacitance of 9.7 fF and a metal capacitance of 3.8 fF giving a combined load of 13.5 fF per load cell 30. As illustrated, in the baseline configuration 128 cells will be placed together to form load cell 30 to be driven by logic block 20 and buffer block 18. The total load will then be 1728 fF (128 * 13.5 fF). This is equivalent to a PMOS/NMOS gate size of 864 $\mu$, or as indicated, PN864. Dividing the PN load by the baseline stage ratio of 3.5 sets the total PN of the scaled buffer 28 at PN247 and the total PN of buffer 26 at PN71 while that of fixed size buffer 24 is set at PN 20.

For the scaled buffer 28, the PMOS transistors thereof will be three times the size of the NMOS transistors or P185 and N18 Similarly, for scaled buffer 26 a value of P53 and N62 with fixed buffer 24 P15 and N5. It is important to note that as the number of load cells change, the PMOS and NMOS sizes of the two scaled buffers will change, however, the size for the fixed buffer will not.

The capacitive loading and buffer sizing for all circuit modules is continued (substeps 18 and 20) of the first level of peripheral circuit and then is expanded outward in a like manner for all circuit modules comprising the second or additional peripheral circuitry interfacing with the first peripheral circuit and the memory array designed at substep 12. For each circuit module or block comprising the periphery circuitry, sizing of the buffers can vary over a large degree to best optimize circuit performance; later discussions will provide an example of several iterations of buffer sizing.

Once all circuit modules for the baseline configuration have been designed, a complete transistor level circuit design is made using standard commercial software such as CADENCE design software. Step 10 is then completed and the flow continues to step 40 where, again, using standard computer aided design (CAD) layout software tools, a complete physical layout of each circuit module or block is made. From the physical layouts of each circuit module the next step, step 42 involves assigning X-Y coordinates, as is generally understood to those skilled in the art, to critical features of the device layouts such as transistor locations, metal line centerlines, and contact placements. Design rules are attached to these landmark definitions to insure that as fabrication processes change, or as device sizes change, process rule violations will not occur.

Once all of the circuit modules for the baseline configuration have been designed, laid out and X-Y coordinates made, steps 10–42, the next step 50 is to write into code, e.g.., using (C+) programming code, the description of the physical layout and landmarks. Hence, at step 50 a computer coded file is obtained for all of the physical description of the baseline configuration. The computer coded file of step 50 executes four key functions. The first function is substep 52a which handles defining transistor sizing. Whenever any compilation is invoked, substep 52a will calculate anew all transistor sizes for the memory architecture being designed. The method is the same as shown in step 10–20, except that the load cell must initially be assumed to be different. Thus, in this step each module load cell is redefined and is multiplied by the number of loads. If, as in the earlier example, there are two scaled buffers between the load and the fixed buffer, the cube root will be taken of the PN equivalent of the load divided by the PN of the fixed buffer. The result is the stage ratio (f) that will be used to size the scaled buffers. If there is only one scaled buffer, then the square root is taken of the load PN equivalent divided by the fixed PN of the fixed buffer, etc..

The next substep, 52b, defines the physical placement of the metal lines, transistors, via connections, input and output locations and so forth. This corresponds to a section of code wherein all of the landmark values are declared in relationship to one another. Substep 52c provides a transistor level definition in code of each circuit module. Finally, substep 52d contains commands in code that will extract key capacitances from each circuit module that will be critical in determining the sizes of the buffers stages of any other peripheral modules that will be driving the input nodes of the aforementioned circuit modules.

The final step 60 in the flow of the development of the baseline configuration model is the compiling of all the code files for each of the circuit models comprising the baseline configuration into a single complete memory device, i.e., a SRAM, ROM and so forth.

Once the initial design, layout and program coding steps have been written and tested, and once all electrical schematic and physical layout verification routines have been run to verify the functionality of the code, the next step of characterization, step 70 is initiated from which mathematical equations will be derived that explain key parameters and properties of the memory. Again, standard software tools are available for the characterization step such as DRACULA, TIMEMILL, POWERMILL, etc. Since there all literally hundreds of thousands of possible physical layouts for each memory configuration, selection of a single subset of relatively few (30–50) configurations for characterization is required. Using a small number of configurations, it is possible to generate highly accurate sets of equations for each memory architecture. The selection of the subsets for characterization is however most critical. The subsets, as will be explained, are chosen in such a way as to accurately represent the full range of possible configurations for the memory architecture using known statistical analysis.

Figure 4:
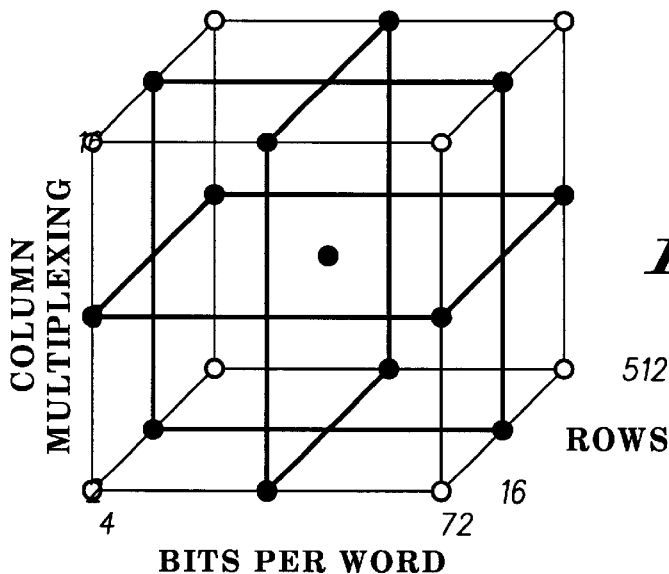
FIG. 4 shows a matrix set representing all possible configurations for a memory device to be characterized using the steps of the present invention.
Figure 5:
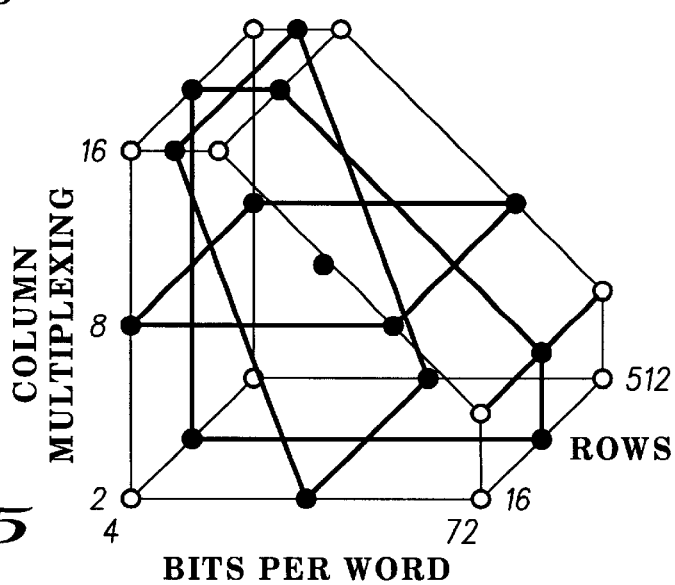
FIG. 5 is a modified matrix set of all possible valid configurations allowed for a memory device characterized using the steps of the present invention.

Referring now to FIGS. 4 and 5, an adjusted combination of two sample sets is used. The first set is referred to as a Full Factorial set. For a three variable analysis, see FIG. 4, this is depicted as a set of corner points of a cube, shown by the white circles, of the extreme combinations of the three variables; in the present case the three variables are the bits per word, the rows, and the column multiplexing factor of the particular memory architecture being analyzed. The second set is called a Box-Benken scheme, which for a three variable analysis consists of the central points of each edge of the three variable cube; these are shown by the dark circles. The combination of the two sets is illustrated in FIG. 4 and include the center point of the variable cube. In determining the characterization matrix setup, substep 72a of step 70, care must be taken is setting the points of the matrix to be run. The extreme points represent the configuration limits of each memory architecture, such as 16 to 512 rows, 4 to 72 bits per word, and column multiplexing values of 2, 4, 8 and 16. The ranges of rows and bits per word are continues, and must be treated as such. The column multiplexing variable is usually a discrete variable and values such as 10 or 13 are not allowed. Along with the foregoing variable restrictions, there will generally be a physical limit imposed on the number of columns inside a memory array. For example, if that physical limit is 288 columns of memory cells, the maximum 72 bits per word is possible for a column multiplexing factor of 2 as well as 4. However, the maximum number of bits per word for a column multiplexing factor of 8 is 32, and only 18 bits per word for a column multiplexing factor of 16. Therefore, part of the full matrix cube of configurations of FIG. 4 will be invalid and this matrix must be adjusted. FIG. 5 shows the adjusted matrix wherein the matrix cube of FIG. 4 has been skewed to show only the valid points for a given memory architecture.

Once the matrix set has been determined, all matrix configurations of the memory configuration are simulated, substep 72b, using the standard simulation software tools mentioned above. The next substep, 72c, is to evaluated the results from substep 72b once the simulated is completed and tabularized. In substep 72c, a standard statistical software tool is used for analyzing the data using multivariate regression techniques. Multivariate regression analysis is a technique in which changes in dependent variables are evaluated against changes in independent variable values. Changes in the independent variables which correlate highly with observed variations in the simulation responses are allowed to remain in the characteristic equations. These equations can be generated in substep 74d to describe expected speed, power, size and many other aspects of the memory architecture. These equations are then written into an equation file which is invoked whenever the SAMI (step 80) is interactively addressed by a user who specifies a requested memory architecture size.

Step 80 of the described flow is the SAMI interface itself. When a user interactively supplies the interface with particular memory requirements, substep 80a, a table of all possible row, block, and column multiplexing combinations, which meet the user's requirements is generated. The set of characterization equations that was generated from the memory design is then used to predict the key parameter values for each configuration (substep 80b). The user then chooses which configuration best meets the required needs, substep 80c, and proceeds to obtain either the view generation, substep 80d, of the chosen configuration or with the generation of a GDSII file for the chosen configuration, substep 80e. FIG. 8 is a representation of the generation of the option table listings, in this case nine different configurations of a 4 k×32 RAM are listed from which the user may select. For example, the first option would show the user he could choose a 512 row device with a column multiplexing factor of 2. The area of the memory would be 10,480 square mils, having an aspect ratio of 2.13, etc. or a 512 row configuration could be chosen having a column multiplexing factor of 8, total die area of 9,206 square mils, etc.

If the user selects the option for generation of a GDS file, substep 80e, the following substeps are executed by the SAMI interface. First, the full chip compilation routine of step 60 is invoked to generate the new memory selected from the SAMI option table of FIG. 8 by the user. The first part of the selected memory to be generated is the memory array which is carried out by substep 80e.1. This is followed by followed by the generation of the first level of peripheral circuitry to interface with the memory array at substep 80e.2, followed by generation of subsequent levels of peripheral circuitry, I/O devices, etc. at substep 80e.3. The last stage of circuit generation is to derive the power bus, substep 80e.4. Once all of the generation substeps have been establish, the memory array is converted into the GDS coded files. The substeps 80.e.1–80e.4 are generated in a like manner as described above for step 10 and its related substeps.

Figure 7:
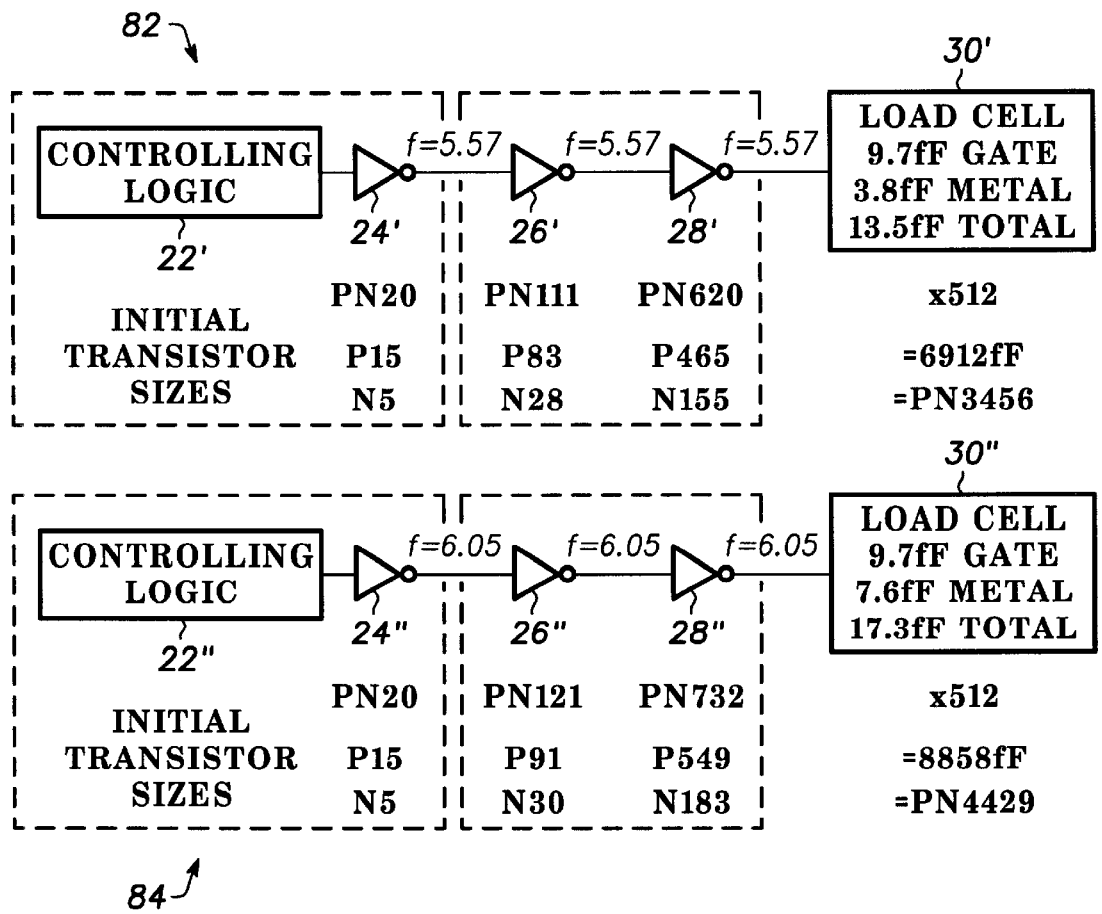
FIG. 7 illustrates the scaling of buffers dynamically to meet the user specified requirements of a memory device in accordance with the present invention.

At substeps 80.e.2 and 80.e.3; generation of the peripheral circuitry is dynamic. Most likely, the loads of the memory array or first level peripheral circuitry selected by the user are different than those designed for the baseline configuration. Hence, all scaled buffer sizes must be dynamically scaled as the compiler generates the full circuit from the memory cells expanding outwards. An example of this scaling routine is illustrated in FIGS. 6 and 7.

If, for example, the user has selected a memory from the first option listed in the table of FIG. 8 an initial sizing based on 512 row placements would be determined as shown by diagram 82. As, illustrated the initial load cell 30' would have a capacitance loading effect equal to 6912 fF based on the initial load of 13.5 fF per cell. This gives an equivalent to a PMOS/NMOS gate size of PN3456. This requires that a stage ratio factor of f=5.57 instead of 3.5 for the baseline configuration. The stage ratio of f=5.57 sets the PN of buffer stage 28' at PN620, scaled buffer stage 26' at PN111, and the fixed buffer stage at PN20 (the same as for the baseline configuration of FIG. 3). Assuming that the characteristic equations estimated this new configurations cycle time to be 20 ns, dV/dt is equal to 1.14 ma of AC current (see the top line of table listings of FIG. 6). The current capabilities of a 0.9 $\mu$ wide metal line with 0.8 ma/$\mu$ is only 0.72 ma, well below the required 1.14 ma. The metal line width will therefore have to be widened. However, as the metal line is widened, its plate capacitance will increase, which in turn, will increase the AC current requirement. Again, the first iteration of table FIG. 6 shows that to draw 1.14 ma of AC current requires a metal line width of 1.426 $\mu$, or an increase in width of 58% over the baseline configuration dimension.

The increased metal line width to 1,426 µm changes the new cell load capacitance of 15.7 fF, which requires a 1.542 µm line, resulting in a 71% increase of plate capacitance. Therefore, for each new iteration more current is required until at some point the incremental change in the metal line width requirement begins to level off. As the table shows, by the 7th iteration, the load has leveled off at 17.4 fF per cell, with a required metal line width of approximately 1.837 µm and a current requirement of 1.47 ma. From the buffer sizing layout 84 this last iteration requires a resizing of the scalable buffers 26" and 28" with a stage ration f=6.05.

In summary, for every new configuration, not only must the buffers transistor sizes be dynamically scaled, but the width of potentially heavily loaded signal lines and the number of vias on those lines must be evaluated and possibly modified. The characteristic equations of substep 80.b are critical for making these modifications.

Hence, what has been described is a compiler methodology including a stand alone memory interface which provides a user specified memory device based on prior characterization of a small subset of memory configurations. The user obtains a menu generated by the stand alone interface in real time showing multiple configurations from which the user's request can be physically configured. From this listing the user selects the memory configuration that best meets his requirements.

What is claimed is:

1. A memory compiler methodology including a stand alone interface through which an user may specify a certain type of memory device of specific requirements and which will provide the user a menu listing several options of such memory device that meets the user's requirement based on a precharacterization of all valid configurations of the type of memory device architecture, comprising the steps of:

1) initially designing a baseline configuration for the memory device architecture from which the user may specify a memory device, including the substeps of:
       a) generating the transistor level circuitry for the various circuit blocks comprising the baseline configuration;
       b) generating a physical layout and X-Y coordinates to predetermined critical features of the physical layout for each of the various circuit blocks;
       c) converting the subsets 1a and 1b into computer code files;
   2) compiling all of the computer code files and verifying the functionality thereof across all architectural variables;
   3) selecting a small number of subsets of all possible configurations of the memory device;
   4) statistically analyzing each of the subsets to derive characteristic mathematical equations which represent key parameters and properties for all valid configurations of the memory device;
   5) compiling all of the mathematical equations into a computer code file; and
   6) providing the stand alone interface through which the user enters a requested memory device wherein the stand alone interface invokes the characteristic mathematical equations to provide the user the menu listing several configurations of the memory device which meets the user's requirements.

2. The memory compiler methodlogy of claim 1 further comprising the substep of the stand alone memory interface generating software tool views based on the memory device selected by the user from the menu provided in step 6.

3. The memory compiler methodology of claim 1 further comprising the substep of the stand alone memory interface generating a physical data file of the memory device selected by the user from the menu provided in step 6.

4. The memory compiler methodology of claim 3 wherein the substep of the stand alone memory interface generating a physical data file further comprising the substeps of:
   a) the stand alone memory interface invoking step 5 to generate the memory device selected by the user in step 6;
   b) generating the memory array for the selected memory device;
   c) generating the peripheral circuitry for the selected memory device; and
   d) generating the power bus for the selected memory device.

5. In a memory compiler and method to provide a user specified memory device comprising the steps of:
   1) precharacterizing a baseline configuration of the type of memory device from which all possible configurations are based on, to derive characteristic mathematical equations representing key parameters and properties of all possible valid configurations of the type of memory device; and
   2) providing a stand alone memory interface through which a user specifies a memory device of a particular configuration and size wherein the stand alone memory interface invokes the characteristic mathematical equations of step 1) to predict the key parameter values for each possible memory configuration that meets the requirements of the user specified memory device and provides a menu listing each possible memory configuration from which the user then chooses the configuration of the memory device that best meets his needs.

6. The memory compiler of claim 5 wherein the precharacterizing step further includes the steps of:
   1a) initially designing the baseline configuration for the memory device;
   1b) generating the transistor level circuitry for the various circuit blocks comprising the baseline configuration;
   1c) generating a physical layout and X-Y coordinates to predetermined critical features of the physical layout for each of the various circuit blocks;
   1d) converting the subsets 1a and 1b into computer code files;
   1e) compiling all of the computer code files and verifying the functionality thereof across all architectural variables;
   1f) selecting a small number of subsets of possible configurations of the memory device;
   1g) statistically analyzing each of the subsets to derive characteristic mathematical equations based on a three variable analysis which represent key parameters and properties for all valid configurations of the memory device; and
   1h) compiling all of the mathematical equations into a computer code file.

7. The memory compiler of claim 6 further comprising the substep of the stand alone memory interface generating software tool views based on the memory device selected by the user from the menu provided in step 2.

8. The memory compiler claim 7 further comprising the substep of the stand alone memory interface generating a physical data file of the memory device selected by the user from the menu provided in step 2.

9. The memory compiler of claim 8 wherein the substep of the stand alone memory interface generating a physical data file further comprises the substeps of:

a) the stand alone memory interface invoking substep 1*h*) to generate the memory device selected by the user in step 2;
b) generating the memory array for the selected memory device;
c) generating the peripheral circuitry for the selected memory device; and
d) generating the power bus for the selected memory device.

* * * * *